United States Patent
Steckel

(10) Patent No.: US 9,340,167 B2
(45) Date of Patent: May 17, 2016

(54) INTERIOR TRIM PART AND EXTERIOR FACING PART OF A VEHICLE HAVING AN ULTRASONIC SENSOR

(75) Inventor: Michael Steckel, Vilsbiburg (DE)

(73) Assignee: LISA DRAEXLMAIER GMBH, Vilsbiburg (DE)

( * ) Notice: Subject to any disclaimer, the term of this patent is extended or adjusted under 35 U.S.C. 154(b) by 661 days.

(21) Appl. No.: 13/580,428

(22) PCT Filed: Feb. 18, 2011

(86) PCT No.: PCT/EP2011/052427
§ 371 (c)(1),
(2), (4) Date: Nov. 7, 2012

(87) PCT Pub. No.: WO2011/104185
PCT Pub. Date: Sep. 1, 2011

(65) Prior Publication Data
US 2013/0061679 A1    Mar. 14, 2013

(30) Foreign Application Priority Data

Feb. 24, 2010 (DE) .......................... 10 2010 002 282

(51) Int. Cl.
| | |
|---|---|
| *G01N 29/00* | (2006.01) |
| *B60R 16/00* | (2006.01) |
| *G01S 7/521* | (2006.01) |
| *H03K 17/94* | (2006.01) |

(52) U.S. Cl.
CPC ................ *B60R 16/00* (2013.01); *G01S 7/521* (2013.01); *H03K 17/94* (2013.01); *H03K 2217/94005* (2013.01)

(58) Field of Classification Search
CPC .......... B60R 16/00; G01S 7/521; H03K 17/94
USPC ........................................... 73/632
See application file for complete search history.

(56) References Cited

U.S. PATENT DOCUMENTS

| | | | | |
|---|---|---|---|---|
| 5,149,986 | A |   | 9/1992 | Jalbert |
| 5,477,942 | A | * | 12/1995 | Shea et al. ............ 187/395 |
| 6,440,534 | B1 | * | 8/2002 | Wilson ................ 428/174 |

(Continued)

FOREIGN PATENT DOCUMENTS

| | | |
|---|---|---|
| DE | 10126670 A1 | 5/2002 |
| DE | 10342006 A1 | 3/2005 |

(Continued)

*Primary Examiner* — Jacques M. Saint Surin
(74) *Attorney, Agent, or Firm* — Finnegan, Henderson, Farabow, Garrett & Dunner LLP

(57) ABSTRACT

The invention relates to an interior trim part of a vehicle, in particular a motor vehicle, comprising a composite having a carrier (30) and a decorative element (10) on one side of the carrier, the decorative element comprising a viewing side (11) visible to an observer from the interior (100) of the vehicle comprising a substantially continuously closed surface at least in a partial region ($B_1$), characterized in that the composite is thinner within the partial region ($B_1$) facing away from the viewing side perpendicular to the viewing side, and is capable of ultrasonic vibration in the thinned region ($B_1$), and by an ultrasonic sensor having an ultrasonic transducer, wherein the ultrasonic transducer is connected to the side of the composite facing away from the viewing side (11) over the entire surface of the thinned area ($B_1$).

17 Claims, 1 Drawing Sheet

(56) References Cited

U.S. PATENT DOCUMENTS

| | | | |
|---|---|---|---|
| 6,765,158 B1* | 7/2004 | Morrison et al. | 200/5 R |
| 6,825,594 B1* | 11/2004 | Thurn | 310/334 |
| 7,756,611 B2* | 7/2010 | Sugiura | 701/1 |
| 2004/0075360 A1* | 4/2004 | Stadelmann | 310/311 |
| 2005/0133351 A1* | 6/2005 | Hein | 200/310 |
| 2005/0134116 A1* | 6/2005 | Hein et al. | 307/10.1 |
| 2010/0027818 A1* | 2/2010 | Lee et al. | 381/191 |

FOREIGN PATENT DOCUMENTS

| | | |
|---|---|---|
| DE | 10359297 A1 | 7/2005 |
| DE | 102006012336 A1 | 11/2006 |
| DE | 102006002232 B4 | 7/2007 |
| DE | 102007028063 B4 | 3/2008 |
| DE | 102007013078 * | 9/2008 |
| DE | 102007013078 A1 | 9/2008 |
| DE | 102007024874 A1 | 12/2008 |
| DE | 102007054347 B3 | 2/2009 |
| DE | 102008026488 A1 | 12/2009 |
| DE | 102008055865 A1 | 5/2010 |
| EP | 0038899 A2 | 11/1981 |
| EP | 0 308 899 A2 | 3/1989 |
| EP | 0675600 A1 | 10/1995 |
| EP | 1762861 A1 | 3/2007 |
| WO | WO 0237516 A2 | 5/2002 |
| WO | WO 03/008860 A1 | 1/2003 |
| WO | WO 2005/001892 A2 | 1/2005 |
| WO | WO 2006039315 A2 | 4/2006 |

* cited by examiner

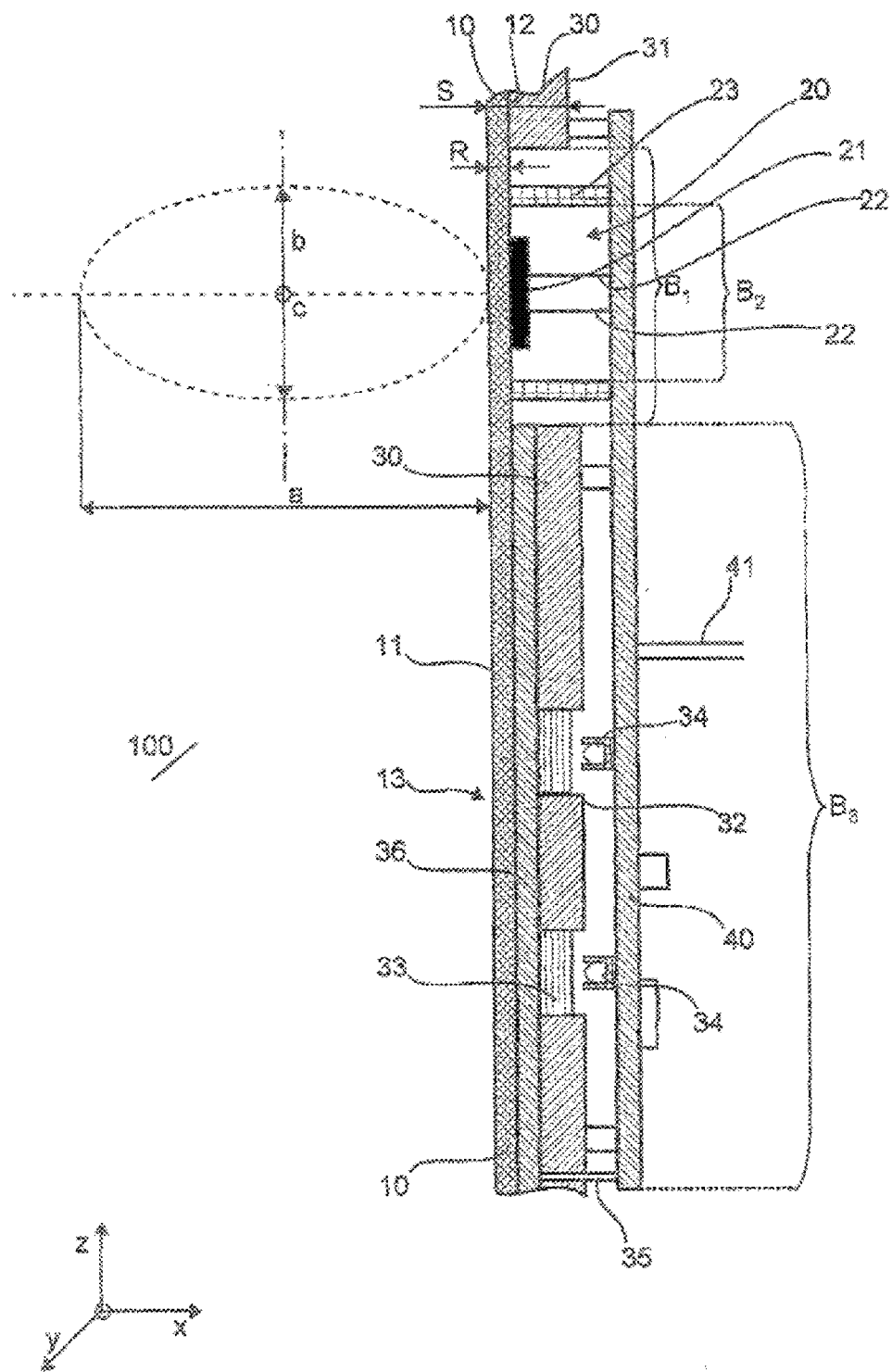

INTERIOR TRIM PART AND EXTERIOR FACING PART OF A VEHICLE HAVING AN ULTRASONIC SENSOR

The present invention relates to interior trim parts of vehicles and, in particular in this case, of motor vehicles. Interior trim parts can be, for example, door interior facings, centre consoles, instrument panels, the headliner, or similar parts. In particular, the invention in this case relates to an interior trim part having the features in the preamble of Claim 1. Moreover, the present invention can also be applied in the case of exterior facing parts of a vehicle such as, for example, a bumper.

In vehicles, a multiplicity of positioning functions or switch-on and switch-off commands, for various types of components or actuating elements, can be selected, activated or deactivated. Thus, for example, it is usual for the windows, the sliding roof, the exterior mirrors or the like to be adjusted, raised, lowered or opened and closed by means of electrically actuated positioning motors. Also provided in vehicles are a multiplicity of function keys, by means of which the electrical loads, for example heating systems, air-conditioning systems, light elements, multimedia systems, on-board computers, navigation systems and the like, can be operated or can be adjusted in any conceivable manner.

The actuating elements for such components and loads are provided, for example, in the centre console, in the instrument panel and/or in or on the steering wheel and in the door facing.

The various actuating elements are designed in this case not solely in consideration of advantageous functioning and ergonomics, but also advantageous appearance. For this purpose, particularly in the region of the instrument panel and the steering wheel, it is usual for the actuating elements to be disposed within a decorative layer.

The trend of more recent development is for the actuating elements to be provided in the form of capacitive or pressure-sensitive keys, e.g. piezoelectric keys, which are disposed under the decorative layer, or under a substantially continuously closed viewing side of the decorative layer. The viewing side in this case denotes the side of the decorative element that is discernible, i.e. seen, by a viewer, the user of the actuating element. This has both visual and functional advantages, which can be achieved by the seamless or gapless transitions between individual actuating elements and the decorative element. In respect of interior trim parts designed in such a manner, reference is made to DE 10 2007 054 347 B3 and to DE 103 59 297 A1.

Moreover, in the case of more recent designs, it is preferred that the actuating elements be disposed so as to achieve what is known as a vanishing effect, or also black panel effect. This means that the control elements, or their symbols, are initially not visible, and the decorative element has a continuous, uninterrupted appearance. It is only when the operator approaches the respective control element or actuating element that the symbol becomes illuminated, and the respective control element or elements become visible. In relation to this, reference is made to DE 10 2007 013 078 A1.

Hitherto, capacitive proximity sensors have been used for this purpose in the prior art. Capacitive proximity sensors have the disadvantage, however, that their range is very limited. As a result, the vanishing effect, or black panel effect (i.e. the illumination of the symbols when approached by a hand) is not fully exploited since, as the symbols become visible, they are already being concealed by the user's hand. Moreover, capacitive sensors react only to electrically conductive material, such that, for example, prostheses cannot be identified.

Further, it is sought to use a comparable function in storage compartments (e.g. in door interior trims). Thus, for example, it would be possible to provide illumination of the compartments that, if possible, should be switched on only when it is sought to access the respective compartment, i.e. thus, here again, when the hand approaches the respective compartment.

The object of the present invention consists, in respect of the above statements, in further developing an interior trim part, of the type stated at the outset, in such a way that a user intervention can be identified in a relatively large monitored space or region, without the need to relinquish the visual appearance of the decorative element, in particular in respect of its continuously closed surface.

This object is achieved by an interior trim part having the features of Claim 1. Advantageous embodiments can be found in the dependent claims. Moreover, the use of the concept of the invention in exterior facing parts of vehicles, as defined in Claim 12 and in the dependent claims that follow, has been found to be an advantageous secondary effect.

The basic concept of the present invention consists in using an ultrasonic sensor as a proximity sensor and connecting this ultrasonic sensor with full surface contact to the back side of the interior trim part, in such a way that the interior trim part, or a part thereof, functions as a membrane of the ultrasonic sensor. As a result, the continuously closed surface of the decorative element can be maintained, such that, in respect of visual effect, there is no impairment in comparison with the prior art. In principle, the use of ultrasonic sensors is known only in connection with a "clear view" of the space or region to be monitored. This means that, hitherto, it has not been known that the ultrasonic sensor can be disposed behind closed surfaces. Surprisingly, however, it has been found that, if disposed behind a layer having a closed surface and an appropriately small thickness of generally less than 3 mm, the layer can be used as a membrane of the ultrasonic sensor. This surprising effect is the basis of the present invention.

Accordingly, the present invention proposes an interior trim part of a vehicle, in particular of a motor vehicle. The interior trim part can be, for example, the instrument panel, the centre console, the headliner, door interior facings, this list being non-exhaustive. The interior trim part comprises a composite having a carrier and a decorative element on one side of the carrier. The decorative element can be laminated directly onto the carrier, i.e. connected to the latter. Alternatively, it is also conceivable to provide one or more intermediate layers, e.g. a haptic layer in the form of a spacing layer (e.g. a knitted spacing fabric). Such a layer makes it possible to improve the haptic properties of the decorative element. The carrier will usually be a plastic part, in particular an injection moulded part. Other carrier materials are also conceivable, however, for example made from natural fibres or natural-fibre composite materials. Possibilities for the decorative element include plastic films, leather, synthetic leather (also known as sheet fabric), wood, metals such as, for example, aluminium, but also stone. The decorative element preferably has two sides, of which one faces towards the carrier (possibly connected to the carrier) and the other constitutes a viewing side. A viewing side, in the sense of the present invention, is to be understood to be the side that is discernible by a viewer when the interior trim part is in the integrated state. The decorative element can be painted over or otherwise coated for the purpose of any stabilization or protection. Preferably, such a coating is of an elastic nature, and is preferably transparent or at least translucent, such that the viewing side remains visible. In the following, such a coating is understood to be part of the decorative element.

According to the invention, the decorative element is provided with a substantially continuously closed surface in at least one partial region. In this context, a continuously closed surface is a surface that does not have any through openings from one side of the composite to the other side. The term "substantially" is to be understood in this respect in such a way that natural pores that might possibly exist, for example in the case of materials such as wood or stone, do not result in the surface not being continuously closed. On the contrary, this is to be understood such that a "clear view" (through view), from one side to the other side, does not exist at any point on the partial region. A large-mesh textile, for example, is not a possibility. According to the present invention, within the partial region the composite is made thinner, perpendicularly in relation to the viewing side, from the side that faces away from the viewing side. This means that, within the partial region, the composite has a lesser residual wall thickness than in other regions. For this purpose, the carrier and/or the decorative element can be made correspondingly thinner (e.g. by removal of material, or off-tool). The thinning is effected in such a way that the thinned region is capable of ultrasonic vibration. This can be influenced through additional, deliberately introduced weaknesses, e.g. perforations or weakness lines, which are introduced from the side that faces away from the viewing side and which do not reach the viewing side. In a view perpendicular to the viewing side, the thinned region in this case can be circular, oval, i.e. elliptical, or also rectangular or polygonal in form. Moreover, abstract contours are also conceivable. Additionally provided according to the invention is an ultrasonic sensor that comprises an ultrasonic generator and, preferably, control electronics for the purpose of control and evaluation. The ultrasonic generator is connected with full surface contact to the side of the composite that faces away from the viewing side, in the thinned region. If, for example, the carrier is fully relieved in the region of the thinned portion, the connection with full surface contact is effected to the side of the decorative element that faces away from the decorative element. Here, the decorative element can additionally be thinned in this region, if the decorative element is still of too great a thickness for the decorative element to be capable of vibration. According to a preferred embodiment, the decorative element can therefore be at least partially thinned in the thinned region. If the carrier is only partially thinned and a residual wall thickness of the carrier remains, the ultrasonic sensor will be attached to the side of the carrier that faces away from the viewing side. If necessary, it is possible to effect a connection to the side of any intermediate layer present that faces towards the carrier. As a result of the design according to the invention and, in particular, the full-surface connection of the ultrasonic generator to the side of the composite that faces away from the viewing side in the thinned region, which is capable of ultrasonic vibration, at least a portion of the thinned region of the composite is used as a membrane of the ultrasonic sensor. This membrane, when in use, vibrates with a frequency in the ultrasonic range, and emits ultrasonic waves. Furthermore, the reflected ultrasonic waves cause it to vibrate, which is identified by the ultrasonic generator and can be evaluated by means of the electronic circuitry, for the purpose of deducing an intervention in the monitored space or region and effecting a corresponding function, e.g. the illumination of a symbol, as described in DE 10 2007 013 078 A1, or for the purpose, for example, activating the lighting of a map pocket. The design according to the invention creates an interior trim part that still meets the stringent requirements in respect of appearance and functionality and, at the same, comprises a proximity sensor that identifies interventions in a monitored region within a distance range of up to 1 m.

According to one embodiment, it is conceivable for the ultrasonic generator to have a ceramic, in particular piezoelectric, generator, which is connected with full surface contact to the side of the composite that faces away from the viewing side, i.e. is connected to the decorative element or to the carrier, such that at least a portion of the thinned region of the composite functions as a membrane of the ultrasonic generator. As a result, it is possible to dispense with a separate membrane of the ultrasonic generator, since this membrane is constituted by the composite itself, in particular by only the decorative element. Consequently, the number of parts can be reduced, and the production costs can be minimized.

Alternatively, it is also conceivable to use a conventional ultrasonic sensor, which has a membrane, in addition to the ceramic, in particular piezoelectric, generator. In the case of this embodiment, it is preferred that the membrane be connected, on the one hand, to the generator and, on the other hand, to the side of the composite that faces away from the viewing side, i.e. connected to the decorative element or to the carrier or to any intermediate layer that is present, such that the vibration of the membrane continues to at least a portion of the thinned region of the composite. This has the advantage that conventional ultrasonic sensors can be bought in, without substantial modification, such that the development and production costs are minimized.

According to a particularly preferred embodiment, the connection between the ultrasonic generator and the side of the composite that faces away from the viewing side is effected by material bonding. For example, the materials can be welded. Preferably, however, an adhesive connection is provided.

Furthermore, for the present invention, it is preferred to use a cup-shaped ultrasonic sensor, such that the ultrasonic sensor has a cylindrical element. If the ultrasonic sensor has a separate membrane, the membrane closes off one end of the cylindrical element, in order to constitute the cup. Insofar as at least one portion of the thinned region of the composite constitutes the membrane, the cylindrical element is connected, in particular by material bonding and, most preferably, adhesive bonded, to the side of the composite that faces away from the viewing side. Thus, one end of the cylindrical element is closed by the portion of the thinned region of the composite that functions as a membrane, in order to constitute the cup.

As mentioned at the outset, it is preferred to apply the present invention in the region of the centre console or in the central region of the instrument panel, i.e. in the viewing region, and to monitor a region or space directly in front of a control panel with a plurality of control elements. It is particularly preferred to provide here a control panel having a vanishing effect similar to the design as described in DE 10 2007 013 078 A1. In other words, the control panel is disposed and can be illuminated such that it is not visible when in standby. If, for example, a hand approaches the control panel, the symbols become illuminated and the control panel becomes visible. For this purpose, it is necessary to monitor a space directly in front of the control panel, but without normal movements of the driver or front passenger resulting in the symbols becoming illuminated. For this purpose, it is preferred that the ultrasonic sensor have an astigmatic transmit/receive characteristic, and it is particularly preferred that it have an ellipsoid transmit/receive lobe, in which the long half axis extends in the longitudinal direction of the vehicle and the short half axes extend in the transverse direction of the vehicle and in the height direction, or vertical direction, of the vehicle. As a result, a large distance directly in front of the control panel is monitored, in the longitudinal direction of the vehicle, while only relatively small regions can be monitored in the transverse direction and in the vertical direction. Consequently, only a deliberate intervention in the direction of the control panel triggers the illumination of the symbols. In the case of other areas of application or mounting situations (e.g. map pocket), it may be necessary to adapt the transmit/receive lobe to the circumstances, i.e. the long half axis then no longer lies in the longitudinal direction of the vehicle, for example, but transversely in relation thereto. Depending on the situation, the transmit/receive characteristic can be freely selected. In order to influence the transmit/receive characteristic, it may possibly be advantageous to provide selective reliefs, e.g. linear notches in the thinned region, from the side that faces away from the viewing side, as known, for example, from EP 0 308 899 A2.

Moreover, it has been found to be particularly preferred that the residual wall thickness of the composite in the thinned region is 3 mm or less. In particular, this is dependent on the material used for the carrier and/or for the decorative element. In particular, if, as in the case of a particular embodiment, the carrier is fully relieved in the thinned region and leather is used as a decorative element, it is necessary to provide a residual wall thickness of the leather that is at least in the range capable of vibration, being not more than 3 mm. If a plastic film, e.g. synthetic leather, or also sheet fabric, is used as a decorative element, a residual wall thickness of not more than 2 mm is to be selected. Preferably, for example, aluminium foils or plastic films having a thickness of 0.3 to 0.8 mm can be used, such that no additional thinning of the decorative element is necessary. In particular, if aluminium is used, a residual wall thickness of less than 1 mm is desirable. It is necessary in this case to take into account whether the decorative material has an absorbent effect, as, for example, in the case of leather or synthetic leather, or whether it is particularly stiff, as in the case of metals, wood or stone.

Furthermore, the present invention can also be applied, advantageously, in the case of exterior facings of a vehicle, in particular of a motor vehicle, such as, for example, the bumpers. Ultrasonic sensors are already being used here at present, projecting through openings in the bumper (circular cutouts in the bumper) and thereby having a clear view of the region to be monitored. These ultrasonic sensors can be painted over, if necessary, such that the membrane and the viewing side of the bumper have the same appearance. According to the invention, it would be conceivable for the ultrasonic sensors to be disposed behind the surface (viewing side) of the bumper, and for the bumper to be made thinner in the region in which the ultrasonic sensors are disposed, such that a part of the bumper itself functions as a membrane, as has been described above with reference to the interior trim part.

Advantageous developments, individual features and particular embodiments of the present invention are disclosed by the following description of a preferred embodiment. This disclosure is made with reference to the accompanying drawing, wherein:

FIG. 1 shows a cross section through an interior trim part according to the invention.

A central region of an instrument panel, as an interior trim part, is described, purely by way of example, with reference to FIG. 1. It is understood, however, that the following statements, in particular relating to the mounting of the ultrasonic sensor, can also be applied to other interior trim parts, independently of the control panel described. It is also understood that the present invention, and in particular the designs relating to the ultrasonic sensor, can be used in an exterior facing part such as, for example, a bumper bar of a motor vehicle.

Represented in FIG. 1 is an interior trim part, which shows a composite having a carrier 30 and a decorative element 10.

The decorative element can be, purely by way of example, real leather, synthetic leather (so-called sheet fabric), plastic films, wood veneers, with or without a coating, or even stone layers. The decorative element 10 in this case can be laminated directly onto the carrier 30, i.e. can be connected with full surface contact to the latter. Standard laminating methods can be used for this purpose. It is also conceivable, however, to provide further intermediate layers, having differing functions, between the decorative element 10 and the carrier 30. Purely by way of example, a haptic layer, in the form of a spacing fabric (not represented), may be mentioned here. However, other intermediate layers are also conceivable, and can be provided in accordance with the decorative element selected.

The decorative element 10 has a viewing side 11. In the case of the example represented, the viewing side 11 faces towards the passenger compartment 100 of the motor vehicle, and affords a "clear" view to a viewer in the passenger compartment 100. If the decorative element 10 has a decorative layer having a coating, the viewing side 11 is constituted by the side of the coating that faces towards the passenger compartment 100. Nevertheless, the decorative element 10 must be visible, for which reason the coating is normally transparent, or at least translucent.

In the entire region represented in FIG. 1, the viewing side 11 has a closed, continuous surface. This means that the viewing side 11 does not have any openings that go all the way through the decorative element 10, or the composite. Rather, the viewing side 11 is a planar, smooth surface without through-holes or openings. Nevertheless, recesses (e.g. finger cavities) can be provided in the viewing side 11, for example in the region of the control elements, explained later, in order that the control elements can also be sensed by touch. Even in this case, however, the surface remains closed, i.e. there are no openings or through-holes present in the decorative element 10, or composite, that extend from one side 11 as far as the opposite side 31.

The composite, which in FIG. 1 is composed, purely by way of example, of a decorative element 10 and a carrier 30, has a thickness S normal, i.e. perpendicular, to the viewing side 11.

In a partial region $B_1$, the composite is made thinner, or relieved, in a direction normal to the viewing side 11, i.e. perpendicular thereto. In the case of the embodiment represented, the thinning is effected in such a way that a complete through-hole is provided in the carrier 30, from the side 31 of the carrier that faces away from the viewing side 11 as far as the side 12 of the decorative element that faces away from the viewing side 11, such that the side 12 of the decorative element 10 is exposed in the partial region $B_1$. As a result, a residual wall thickness R is achieved in the partial region $B_1$. The residual wall thickness R in this case is selected in such a way that the composite in the partial region $B_1$ is capable of ultrasonic vibration. Depending on the decorative element used and the thickness of the decorative element 10, the residual wall thickness can be constituted by the decorative element 10 and the carrier 30, by only the decorative element or by only a part of the decorative element 10. In the latter case, it may possibly be necessary for the decorative element 10 likewise to be made thinner in the partial region $B_1$. In the case of a leather layer, for example, this can be effected by splitting in the partial region $B_1$. In the case of leather, the residual wall thickness R is preferably at most 3 mm, preferably less. In the case of a plastic layer, it is preferred to define the residual wall thickness as R≤2 mm, and as R≤1 mm in the case of an aluminium layer. Preferably, aluminium foils having a thickness of 0.3 mm are used here. Alternative films have a residual wall thickness of 0.6 to 0.8 mm, such that there is no need for additional thinning in the case of these films. Here, if necessary, a partial layer of the carrier 30 may even remain in the partial region $B_1$, in order to support the decorative element 10.

As can be seen from FIG. 1, a printed circuit board 40 is provided on the back side 31 of the carrier 30, the printed circuit board being connected to a controller via lines 41. The printed circuit board 40 constitutes a part of the ultrasonic sensor 20, which comprises a ceramic, in particular piezoceramic, generator 21, the electrodes of which, not represented, are connected to the printed circuit board 40 via lines 22 and connected to the electronic circuitry, not represented, via the lines 41. Moreover, the ultrasonic sensor 20 comprises a cylindrical element 23, which is preferably composed of aluminium. In the case of the embodiment represented, the cylindrical element 23 is connected, in particular adhesive-bonded, with full surface contact to the side 12 of the decorative element 10, in the thinned region $B_1$ of the composite. Alternatively, however, welding is also conceivable. Moreover, the piezoelectric generator 21 is likewise connected with full surface contact, in particular by material bonding, to this side 12 of the decorative element 10. An adhesive connection is most preferred here. The cylindrical element 23 in this case is closed by a region $B_2$ of the decorative element 10, so as to constitute a cup of the ultrasonic sensor. In the region $B_2$, the decorative element 10 in this case functions as a membrane of the ultrasonic sensor 20, i.e. is a part of the ultrasonic sensor. Alternatively, it is also conceivable for the cylindrical element 23 to be closed by a membrane (not represented) that, on a side facing towards the back side 31 of the carrier 30, is connected to the piezoelectric generator 21 and, on the other side, is connected with full surface contact, in particular by material bonding, to the side 12 of the decorative element 10. Here, also, an adhesive connection would be preferred. In this case, because the membrane is connected with full surface contact to the back side 12 of the decorative element 10, the vibration of the membrane, initiated by the generator 21, would cause the decorative element 10 itself to vibrate in the partial region $B_2$, such that the decorative element 10 and the membrane together constitute the membrane of the ultrasonic transducer 20.

In a top view, the cylindrical element 23, and therefore the partial region $B_2$ of the decorative element 10 that is capable of vibration, is circular, elliptical, rectangular or polygonal in form, or has an abstract, curved form. Depending on how the transmit/receive characteristic of the ultrasonic sensor 20 is to be selected, the form, i.e. the cross-sectional form, of the cylindrical element 23 and, associated therewith, of the region $B_2$ that is capable of vibration, is selected as is known per se to persons skilled in the art. In addition, for the purpose of setting the transmit/receive characteristic, profiling of the decorative element 10 can be effected from the side 12, as is known to persons skilled in the art from EP 0 308 899 A2. Linear notches, but also perforations and the like, can be made for this purpose. In the case of leather, a laser machining process is a possibility here. Particularly preferably, the cross-sectional form of the partial region $B_2$ and/or the profiling of the back side 12 is selected in such a way that the transmit/receive characteristic of the ultrasonic sensor 20 is astigmatic. In the case of the embodiment represented in FIG. 1, it is particularly preferred in this case that the transmit/receive lobe be ellipsoid in form, as indicated by the broken lines in FIG. 1. It is preferred in this case to locate the long half axis a in the direction of the longitudinal direction (X direction) of the vehicle, while the half axis b extends in the height/vertical direction (Z direction) of the vehicle, and the half axis c extends in the transverse direction (Y direction) of the vehicle. Particularly preferably, for this purpose, the length of the half axis a will be between 30 and 100 cm, while the lengths of the two other half axes will preferably be in a range between 1 and 50 cm. Depending on the requirement, the lengths of the half axes b and c can be equal, or can differ from each other. The ellipsoid represented in the cross section in FIG. 1 indicates the monitored space. If an intervention is made into the ellipsoid, the ultrasonic sensor 20 identifies the intervention and can initiate a desired function. The illumination of the control panel, which is described in greater detail further below, is explained in the following as a non-limiting example of such a function. However, this can also be constituted by other functions. The illumination of a map pocket, as the map pocket is approached in the region of a door interior facing, may be cited, purely by way of example. The use in a bumper, as mentioned at the outset, as a parking aid may also be cited. These application instances, however, are not to be understood as exhaustive.

In the configuration of the ultrasonic sensor 20, provision must be made to select the ultrasonic range far beyond the audible range of humans and animals. Moreover, the sound pressure, which is constantly present in the passenger compartment 100, must be kept as low as possible.

As can be seen from FIG. 1, the decorative element 10 constitutes a viewing side 11. Provided in the partial region $B_3$, in this case, for example, beneath the ultrasonic sensor 20, there is a control panel, which is designed as described in DE 10 2007 013 078 A1, the entire content of which is included by reference. For this purpose, a piezoelectric film 36 is disposed between the decorative element 10 and the carrier 30. Symbols 13 are recessed into the decorative element 10. A recess 32, which is assigned in accordance with the respective symbol 13 and in which optical waveguides 33 can be disposed if necessary, is also located in the carrier 30. Corresponding keys, the control elements, respectively assigned to the symbols 13, are provided on the piezoelectric film 36. LEDs 34, which are assigned to the recesses 32, or to optical waveguides 33 and the symbols 13, are seated on the printed circuit board 40 and, when switched on, backlight the symbols 13 and make them visible on the viewing side 11. The piezoelectric film 36 is likewise connected to the printed circuit board 40 via a line 35. It is understood, however, that separate printed circuit boards can also be used for the ultrasonic sensor 20 and the control panel. In particular, the regions of the symbols are provided with a translucent material, and consequently they are visible only when illumination is switched on (LEDs 34 switched on), as described in DE 10 2007 013 078 A1. This means that, apart from the recessed symbols, the viewing side is substantially non-transparent (opaque). The rest of the viewing side 11 has a non-transparent appearance, and the symbols are not visible when the illumination is switched off. Alternatively, the illumination of the symbols can also be effected from the side. For this purpose, an optical waveguide, or a light-guiding film, such as that known, for illuminating LED displays, from WO 2006/639315 A2, WO 03/008860 A1 or WO 2005/001892 A2, is disposed between the decorative element 10 and the piezoelectric film 36. The optical waveguides 33 can then be omitted, and the LEDs 34 emit light substantially parallel to the viewing side 11 of the decorative element. For further information, the person skilled in the art is referred to DE 10 2008 055 865.

If a user in the passenger compartment 100 of the vehicle approaches the control panel B₃ and, in so doing, reaches into the ellipsoid of the ultrasonic sensor 20, an intervention is identified by the electronic circuitry, not represented, which is connected to the printed circuit board 40 and which evaluates the signals of the ultrasonic sensor 20, and the LEDs 34 are activated. As a result, the symbols 13 are backlit and become visible. The user thus knows the position of the individual control elements, constituted by the keys of the piezoelectric film 36. Pressing with a finger on the viewing side 11 of the decorative element 10, in the region of the symbols 13, causes the piezoelectric keys beneath the symbols to be actuated, and causes the corresponding load, or the corresponding function element, to be operated via the electronic circuitry, not represented. Then, after a defined time window, if necessary, the standby mode can be resumed in that the LEDs 34 are switched off and the symbols 13 become invisible on the viewing side 11 of the decorative element 10.

The invention claimed is:

1. An interior trim part of a motor vehicle comprising:
a composite having a carrier and a decorative element on one side of the carrier, the decorative element comprising a viewing side discernible by a viewer from the interior of the vehicle and having a substantially continuously closed surface at least in a partial region, wherein
within the partial region the composite is thinned, perpendicularly in relation to the viewing side, from a side that faces away from the viewing side, and is configured for ultrasonic vibration in the thinned region, and
an ultrasonic sensor comprising an ultrasonic generator, the ultrasonic generator being connected, in the thinned region, with full surface contact to the side of the composite that faces away from the viewing side, wherein, in use,
the ultrasonic generator causes the thinned region to vibrate with a frequency in the ultrasonic range such that the thinned region emits ultrasonic waves, and
the thinned region vibrates by reflected ultrasonic waves, wherein the reflected ultrasonic waves are identified by the ultrasonic generator to enable evaluation by an electronic circuit.

2. The interior trim part according to claim 1, wherein the ultrasonic generator has a piezoelectric generator, which is connected with full surface contact to the side of the composite that faces away from the viewing side, such that at least a portion of the thinned region of the composite functions as a membrane of the ultrasonic generator.

3. The interior trim part according to claim 1, wherein the ultrasonic generator has a membrane and piezoelectric generator, which is connected to one side of the membrane, the membrane being connected with full surface contact to the side of the composite that faces away from the viewing side, such that the vibration of the membrane is transferred to at least a portion of the thinned region of the composite.

4. The interior trim part according to claim 1, wherein the ultrasonic generator is connected by material bonding to the side of the composite that faces away from the viewing side.

5. The interior trim part according to claim 4, wherein the ultrasonic generator is adhesive-bonded to the side of the composite that faces away from the viewing side.

6. The interior trim part according to claim 1, wherein the ultrasonic sensor has a cylindrical element, which is connected to the ultrasonic generator or to the side of the composite that faces away from the viewing side.

7. The interior trim part according to claim 1, wherein the ultrasonic sensor has an astigmatic transmit/receive characteristic.

8. The interior trim part according to claim 7, wherein the ultrasonic sensor has an ellipsoid transmit/receive lobe having the long half axis in the longitudinal direction of the vehicle and having the short half axes in the transverse direction and in the height direction of the vehicle.

9. The interior trim part according to claim 1, wherein the composite in the thinned region has a residual wall thickness of 3 mm or less.

10. The interior trim part according to claim 1, wherein the carrier is fully relieved in the thinned region.

11. The interior trim part according to claim 10, wherein the decorative element in the thinned region is at least partially thinned.

12. An exterior facing part of a vehicle, comprising:
a body, which comprises a viewing side discernible by a viewer and having a substantially continuously closed surface at least in a partial region, wherein:
within the partial region the body is thinned, perpendicularly in relation to the viewing side from a side that faces away from the viewing side, and is configured for ultrasonic vibration in the thinned region, and
an ultrasonic sensor comprising an ultrasonic generator, the ultrasonic generator being connected, in the thinned region, with full surface contact to the side of the composite that faces away from the viewing side, wherein, in use,
the ultrasonic generator causes the thinned region to vibrate with a frequency in the ultrasonic range such that the thinned region emits ultrasonic waves, and
the thinned region vibrates by reflected ultrasonic waves, wherein the reflected ultrasonic waves are identified by the ultrasonic generator to enable evaluation by an electronic circuit.

13. The exterior facing part according to claim 12, wherein the ultrasonic generator has a piezoelectric generator, which is connected with full surface contact to the side of the body that faces away from the viewing side, such that at least a portion of the thinned region of the body functions as a membrane of the ultrasonic generator.

14. The exterior facing part according to claim 12, wherein the ultrasonic generator has a membrane and a piezoelectric generator, which is connected to one side of the membrane, the membrane being connected with full surface contact to the side of the body that faces away from the viewing side, such that the vibration of the membrane is transferred to at least a portion of the thinned region of the body.

15. The exterior facing part according to claim 12, wherein the ultrasonic generator is connected by material bonding to the side of the body that faces away from the viewing side.

16. The exterior facing part according to claim 15, wherein the ultrasonic generator is adhesive-bonded to the side of the body that faces away from the viewing side.

17. The exterior facing part according to claim 12, wherein the ultrasonic sensor has a cylindrical element, which is connected to the ultrasonic generator or to the side of the body that faces away from the viewing side.

* * * * *